(12) United States Patent
Myers et al.

(10) Patent No.: US 11,573,608 B2
(45) Date of Patent: *Feb. 7, 2023

(54) HIGH TOLERANCE CONNECTION BETWEEN ELEMENTS

(71) Applicant: Apple Inc., Cupertino, CA (US)

(72) Inventors: Scott A. Myers, Saratoga, CA (US); Mattia Pascolini, Cupertino, CA (US); Richard Hung Minh Dinh, Cupertino, CA (US); Trent Weber, San Francisco, CA (US); Robert Schlub, Palo Alto, CA (US); Josh Nickel, Cupertino, CA (US); Robert Hill, Morgan Hill, CA (US); Nanbo Jin, Cupertino, CA (US); Tang Yew Tan, Palo Alto, CA (US)

(73) Assignee: APPLE INC., Cupertino, CA (US)

( * ) Notice: Subject to any disclaimer, the term of this patent is extended or adjusted under 35 U.S.C. 154(b) by 134 days.

This patent is subject to a terminal disclaimer.

(21) Appl. No.: 16/854,795

(22) Filed: Apr. 21, 2020

(65) Prior Publication Data
US 2020/0249724 A1    Aug. 6, 2020

Related U.S. Application Data

(60) Continuation of application No. 16/412,078, filed on May 14, 2019, now Pat. No. 10,664,019, which is a
(Continued)

(51) Int. Cl.
*H01Q 1/22* (2006.01)
*H01Q 1/24* (2006.01)
(Continued)

(52) U.S. Cl.
CPC .......... *G06F 1/1656* (2013.01); *G06F 1/1626* (2013.01); *G06F 1/1658* (2013.01);
(Continued)

(58) Field of Classification Search
CPC .... G06F 1/1656; G06F 1/1626; G06F 1/1658; G06F 1/1684; G06F 1/1698;
(Continued)

(56) References Cited

U.S. PATENT DOCUMENTS

| | | |
|---|---|---|
| 3,519,162 A | 7/1970 | Pickering et al. |
| 5,170,009 A | 12/1992 | Kadokura |

(Continued)

FOREIGN PATENT DOCUMENTS

| | | |
|---|---|---|
| CN | 1122174 | 5/1996 |
| CN | 1419405 | 5/2003 |

(Continued)

*Primary Examiner* — Dimary S Lopez Cruz
*Assistant Examiner* — Michael M Bouizza
(74) *Attorney, Agent, or Firm* — Brownstein Hyatt Farber Schreck, LLP

(57) ABSTRACT

This is directed to connecting two or more elements using an intermediate element constructed from a material that changes between states. An electronic device can include one or more components constructed by connecting several elements. To provide a connection having a reduced or small size or cross-section and construct a component having high tolerances, a material can be provided in a first state in which it flows between the elements before changing to a second state in which it adheres to the elements and provides a structurally sound connection. For example, a plastic can be molded between the elements. As another example, a composite material can be brazed between the elements. In some cases, internal surfaces of the elements can include one or more features for enhancing a bond between the elements and the material providing the interface between the elements.

20 Claims, 8 Drawing Sheets

Related U.S. Application Data continuation of application No. 15/821,301, filed on Nov. 22, 2017, now Pat. No. 10,334,745, which is a continuation of application No. 14/566,222, filed on Dec. 10, 2014, now Pat. No. 9,829,926, which is a division of application No. 12/794,485, filed on Jun. 4, 2010, now Pat. No. 8,913,395.

(60) Provisional application No. 61/325,625, filed on Apr. 19, 2010, provisional application No. 61/325,786, filed on Apr. 19, 2010, provisional application No. 61/300,780.

(51) Int. Cl.
| | | |
|---|---|---|
| *H01Q 1/42* | (2006.01) | |
| *G06F 1/16* | (2006.01) | |
| *H04M 1/02* | (2006.01) | |
| *H05K 5/03* | (2006.01) | |
| *H05K 5/02* | (2006.01) | |

(52) U.S. Cl.
CPC .......... *G06F 1/1684* (2013.01); *G06F 1/1698* (2013.01); *H01Q 1/2258* (2013.01); *H01Q 1/241* (2013.01); *H01Q 1/42* (2013.01); *H04M 1/026* (2013.01); *H04M 1/0249* (2013.01); *H04M 1/0274* (2013.01); *H05K 5/02* (2013.01); *H05K 5/0208* (2013.01); *H05K 5/0247* (2013.01); *H05K 5/03* (2013.01); *Y10T 29/49002* (2015.01); *Y10T 29/49169* (2015.01)

(58) Field of Classification Search
CPC ........ H01Q 1/2258; H01Q 1/241; H01Q 1/42; H01Q 1/22; H04M 1/0249; H04M 1/026; H04M 1/0274; H05K 5/02; H05K 5/0208; H05K 5/0247; H05K 5/03; H05K 5/00; H05K 5/0004; Y10T 29/49002; Y10T 29/49169; H04B 1/38
See application file for complete search history.

(56) References Cited

U.S. PATENT DOCUMENTS

| | | |
|---|---|---|
| 5,173,840 A | 12/1992 | Kodai et al. |
| 5,348,778 A | 9/1994 | Knipp et al. |
| 5,613,237 A | 3/1997 | Bent et al. |
| 6,488,887 B1 | 12/2002 | Arai et al. |
| 7,307,223 B2 | 12/2007 | Tyson et al. |
| 7,511,230 B2 | 3/2009 | Cochrance |
| 7,554,177 B2 | 6/2009 | Geefay et al. |
| 7,920,225 B2 | 4/2011 | Nishikawa et al. |
| 8,012,398 B2 | 9/2011 | Zadesky et al. |
| 8,738,104 B2 | 5/2014 | Yeates |
| 8,772,650 B2 | 7/2014 | Merz et al. |
| 10,664,019 B2 * | 5/2020 | Myers ................ H01Q 1/241 |
| 2008/0164055 A1 | 7/2008 | Wang et al. |
| 2008/0165067 A1 | 7/2008 | Kim et al. |
| 2009/0017263 A1 | 1/2009 | Yeates et al. |
| 2009/0036175 A1 | 2/2009 | Brandenburg et al. |
| 2010/0078343 A1 * | 4/2010 | Hoellwarth ....... B29C 45/14639 |
| | | 206/320 |
| 2010/0207826 A1 * | 8/2010 | Ryou ................ H01Q 1/2266 |
| | | 343/702 |
| 2012/0157175 A1 | 6/2012 | Golko et al. |

FOREIGN PATENT DOCUMENTS

| | | |
|---|---|---|
| CN | 1543301 | 11/2004 |
| CN | 1920734 | 2/2007 |
| CN | 101330164 | 12/2008 |
| JP | 2012150100 | 8/2012 |

* cited by examiner

HIGH TOLERANCE CONNECTION BETWEEN ELEMENTS

CROSS-REFERENCE TO RELATED APPLICATION(S)

This application is a continuation patent application of U.S. patent application Ser. No. 16/412,078, filed May 14, 2019 and titled "High Tolerance Connection Between Elements," which is a continuation patent application of U.S. patent application Ser. No. 15/821,301, filed Nov. 22, 2017 and titled "High Tolerance Connection Between Elements," now U.S. Pat. No. 10,334,745, which is a continuation patent application of U.S. patent application Ser. No. 14/566,222, filed Dec. 10, 2014 and titled "High Tolerance Connection Between Elements," now U.S. Pat. No. 9,829,926, which is a divisional patent application of U.S. patent application Ser. No. 12/794,485, filed Jun. 4, 2010 and titled "High Tolerance Connection Between Elements," now U.S. Pat. No. 8,913,395, which claims the benefit of U.S. Provisional Patent Application No. 61/300,780, filed Feb. 2, 2010, U.S. Provisional Patent Application No. 61/325,625, filed Apr. 19, 2010, and U.S. Provisional Patent Application No. 61/325,786, filed Apr. 19, 2010, the disclosures of which are hereby incorporated herein by reference in their entireties.

BACKGROUND

A portable electronic device can be constructed by connecting different components. For example, an electronic device can include a first housing component serving as a bucket for receiving electronic device components, and a second housing component placed over the first housing component. Any suitable approach can be used to connect the first and second housing components including, for example, one or more snaps or other interlocking features, a mechanical fastener (e.g., one or more screws), an adhesive, or combinations of these. The first and second housing components can each be constructed using any suitable approach including, for example, from a single integral element, or by connecting several distinct elements. For example, the first housing component can be constructed as a single metal structure, and the second housing component can be constructed by combining a glass or plastic window and a metal or plastic band using an adhesive. In some cases, the particular material used in the regions of the first and second housing components that come into contact can be the same or different (e.g., a plastic first housing component and a metal second housing component, or an aluminum first housing component and a steel second housing component).

Other known portable electronic devices can be constructed by inserting components into a hollow housing element. For example, an electronic device can be constructed using a tubular structure (e.g., a flattened tube or a hollow rectangular tube) into which electronic device components can be inserted. The tubular structure can be constructed from a single piece of material, or by connecting several distinct elements, for example using a mechanical fastener. To retain components within the tube, the structure can include caps placed on the opposite ends of the tube. The caps can be retained within the tube using any suitable approach including, for example, using a press-fit, an adhesive, a fastener (e.g., a screw), or combinations of these.

SUMMARY

This is directed to connecting two or more elements using an intermediate element such that the intermediate element remains within the cross-sections of the two or more elements at the interfaces with the elements. In addition, this is directed to using an intermediate element that changes in state to connect two or more elements such that the resulting assembled component can be constructed with high tolerances, while the individual elements connected by the intermediate element can be constructed with low tolerances. Furthermore, the two or more elements can be electrically conductive while the material of the intermediate element can include an insulating or a dielectric material.

An electronic device can be formed by connecting several components or elements. In some embodiments, components providing external surfaces of the device, such as housing components, can be constructed by connecting several elements together. For example, larger elements can be connected to smaller elements. As another example, several elements having substantially similar sizes can be connected. In some embodiments, components within a device can be constructed by connecting distinct elements.

In some embodiments, first and second elements can be coupled using an intermediate element from a material that can change between two states. In a first state, the intermediate element can flow between the first and second elements, and in some cases begin to adhere to the surfaces of the elements with which it is placed in contact. In a second state, the intermediate element can provide a structural and mechanical bond between the first and second elements (e.g., as the intermediate element material transitions from a liquid state to a solid state). By using such a material for the intermediate element, the intermediate element can have a variable length or other dimension such that the first and second elements can be manufactured individually with low tolerances, but the complete assembly can be assembled together with high tolerances.

In addition to allowing individual elements of a component to be constructed with low tolerances, this approach can ensure that the first and second elements are in alignment when they are connected. The first and second elements can be positioned and aligned as required for a final component, and the intermediate element can be placed between the first and second elements. The intermediate element material can then flow between the first and second elements without disrupting the positions of the first and second elements, and thus secure the first and second elements as initially aligned.

In some cases, one or more of the elements being connected (e.g., the first and second elements) can include electrically conductive elements serving as part of an electrical circuit. For example, one or more housing elements can serve as parts of an antenna. As another example, one or more internal elements of a device can be electrically conductive, for example to provide a path between electrical components, or to ground one or more electrical components. Although the individual first and second elements can be conductive, it may nevertheless be desirable for the elements to be electrically isolated. For example, if the first and second elements provide parts of an antenna structure, it may be desirable for the elements to be electrically isolated to ensure that interactions between the first and second elements do not interfere with antenna performance.

The first and second elements can be physically connected while remaining insulated from each other using any suitable approach. In some embodiments, the intermediate element can be constructed from an insulating material, such that the intermediate element provides both a mechanical and a structural connection between the first and second elements, while insulating the elements from each other. The particular material selected for the intermediate element can include any suitable mechanical property including, for example, a particular stiffness or rigidity based on mechanical requirements for the resulting component. The intermediate element can be manufactured using any suitable approach including, for example, molding (e.g., molding a plastic intermediate material) or braising (e.g., braising a ceramic material between the first and second elements).

BRIEF DESCRIPTION OF THE DRAWINGS

The above and other features of the present invention, its nature and various advantages will be more apparent upon consideration of the following detailed description, taken in conjunction with the accompanying drawings in which.

DETAILED DESCRIPTION

An electronic device can include several components assembled together to form internal and external features of the device. For example, one or more internal components (e.g., electrical circuitry) can be placed within external components (e.g., a housing) to provide a device having desired functionality. Different components can be manufactured using several approaches including, for example, by assembling and connecting individual elements. In some cases, an external housing component can be constructed by assembling several elements to form an integral component.

Figure 1:
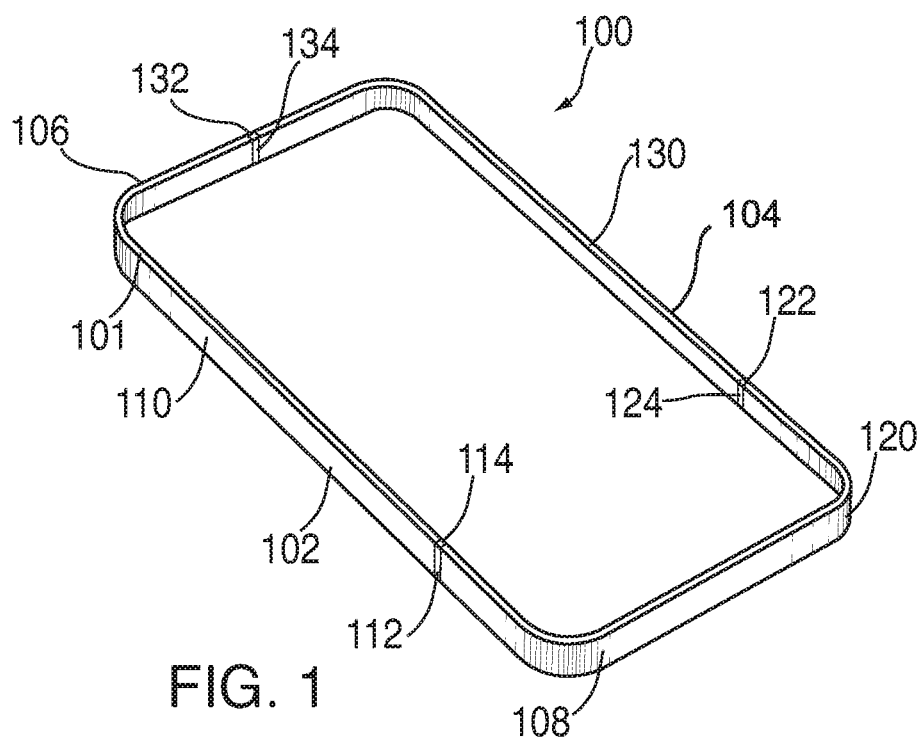
FIG. 1 is a schematic view of an illustrative outer periphery member constructed by connecting several elements in accordance with one embodiment of the invention.

FIG. 1 is a schematic view of an illustrative outer periphery member constructed by connecting several elements in accordance with one embodiment of the invention. Outer periphery member 100 can be constructed to form an exterior surface for an electronic device. In particular, outer periphery member 100 can surround or wrap around some or all of the electronic device such that outer periphery member 100 defines an internal volume into which electronic device components can be placed. For example, outer periphery member 100 can wrap around the device such that external surfaces 101 of outer periphery member 100 define a left surface 102, a right surface 104, as well as a top surface 106 and a bottom surface 108 of the device. To provide a desired functionality to a user, the electronic device can include several components placed within the device, for example within the internal volume of the outer periphery member.

The thickness, length, height, and cross-section of the outer periphery member can be selected based on any suitable criteria including, for example, based on structural requirements (e.g., stiffness, or resistance to bending, compression, tension or torsion in particular orientations). In some embodiments, the outer periphery member can serve as a structural member to which other electronic device components can be mounted. Some of the structural integrity of outer periphery member 100 can come from the closed shape that it defines (e.g., outer periphery member 100 forms a loop).

Outer periphery member 100 can have any suitable cross-section. For example, outer periphery member 100 can have a substantially rectangular cross-section. In some embodiments, outer periphery member 100 can instead or in addition have a cross-section in a different shape including, for example, a circular, oval, polygonal, or curved cross-section. In some embodiments, the shape or size of the cross-section can vary along the length or width of the device (e.g., an hourglass shaped cross-section).

The outer periphery member of an electronic device can be constructed using any suitable process. In some embodiments, outer periphery member 100 can be constructed by connecting distinct elements 110, 120 and 130 at interfaces 112, 122 and 132. The elements can have any suitable shape including, for example, large L-shape element 110, small L-shape element 120, and U-shape element 130. Each element can be constructed individually and later assembled to form outer periphery member 100. For example, each element can be constructed using one or more of stamping, machining, working, casting, or combinations of these. In some embodiments, the materials selected for elements 110, 120 and 130 can be conductive to provide an electrical functionality to the device (e.g., serve as part of an antenna).

To join the individual elements, intermediate elements 114, 124 and 134 can be placed within interfaces 112, 122, and 132, respectively. In some embodiments, each of the intermediate elements can be constructed from a material that can initially be provided in a first state in which the material can flow between elements 110 and 120, elements 120 and 130, and elements 130 and 110 when placed in interfaces 112, 122 and 132, respectively. The material can subsequently change to a second state in which the material bonds together elements 110 and 120, 120 and 130, and 130 and 110, respectively, to form a single new component (e.g., an integral component).

Different approaches can be used to connect individual component elements together. For example, a mechanical fastener, connector or other connector element can be coupled to several component elements that are assembled together. A connector element can have any suitable size relative to the elements being connected. In some cases, one or more portions of the connector element can extend along a side surface of an element, or otherwise extend beyond a boundary defined by a cross-section of the elements (e.g., when two elements are connected end to end, such as outer periphery member elements, as described above in connection with FIG. 1). In some cases, an adhesive can be used instead of or in addition to a mechanical fastener or connector. For example, an adhesive layer can be placed between the components being connected. The adhesive layer can be provided using any suitable approach including, for example, as a liquid or paste adhesive, tape, heat-based adhesive, or combination of these. In some embodiments, an adhesive layer can have a reduced thickness or width (e.g., reducing the space between the elements) to ensure that the elements are properly connected. This may be due to mechanical properties of the adhesive, as a thicker layer of the adhesive may have limited strength in bending, compression, peeling, tension, or several of these.

Figure 2:
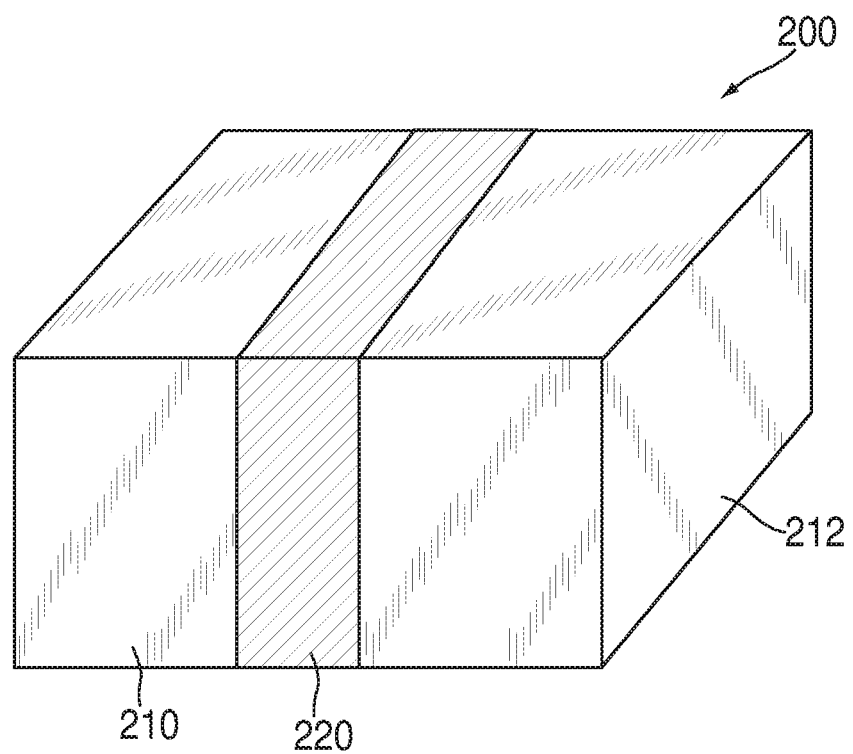
FIG. 2 is a schematic view of an illustrative electronic device component in accordance with one embodiment of the invention.

While these approaches can be effective to couple elements, they can also require the profile of a component to increase (e.g., beyond the cross-section of the elements being connected) or can limit the width or size of the connector (e.g., only allow a film layer between the elements). In addition, some of these approaches may require that the individual elements be accurately manufactured (e.g., with high tolerances) to ensure that the resulting component is also manufactured within high tolerances. FIG. 2 is a schematic view of an illustrative electronic device component in accordance with one embodiment of the invention. Component 200 can be constructed from first element 210 and second element 212, which can be connected by intermediate element 220. First and second elements 210 and 212 can be constructed from any suitable materials including, for example, the same or different materials. For example, first and second elements 210 and 212 can be constructed from one or more of a metal, plastic, a composite material, an organic material, or combinations of these. In some cases, one or both of the elements can be constructed from conductive materials (and thus be used as part of circuitry within the device), but may need to be electrically isolated from one another for proper functioning of device circuitry. In such cases, the intermediate element can be constructed from an insulating or dielectric material to prevent an electrical signal from crossing the gap between first element 210 and second element 212.

The individual elements of the component can be positioned using any suitable approach. For example, individual elements can be aligned such that cross-sections of each element are aligned with each other (e.g., the elements are non-overlapping). As another example, individual elements can be positioned relative to each other such that the cross-section of the portions of intermediate element 220 at the interfaces with the first and second elements do not extend beyond the cross-sections of the first and second elements at the interfaces.

Intermediate element 220 can have any suitable size. For example, intermediate element 220 can have any suitable length (e.g., defining the distance between first and second elements 210 and 212), including a length that is substantially the same size or larger than a length associated with one or both of first and second elements 210 and 212. Alternatively, the length of intermediate element 220 can be less than a length associated with one or both of first and second elements 210 and 212 (e.g., but at least 0.25 mm, such as 0.5 mm or 1 mm). In some embodiments, the length or shape of intermediate element 220 can be selected based on mechanical properties of the intermediate element material. For example, the intermediate element can include a variable width or cross section in the region between the elements.

In some embodiments, the size or shape of intermediate element 220 can vary between different components. For example, some or all of first and second elements 210 and 212 can be constructed with relatively low tolerance, such that the length of arms or portions of the first and second elements that are placed in contact with the intermediate element can vary. In particular, first and second elements 210 and 212 can be initially manufactured with lower tolerances, then positioned in a fixture having higher tolerances. Intermediate element 220 can be placed between the first and second elements. The material and process used to connect intermediate element 220 between first and second elements 210 and 212 can be selected such that the material can initially be provided in a first state in which the material can fill the gap or space, or span the interface between the first and second elements. For example, the material can be provided as a liquid or a moldable solid (e.g., a soft clay-like state) such that the material can be shaped into an intermediate element. In some embodiments, the fixture can define boundaries and features (e.g., protrusions or detents) within the intermediate element surfaces.

Once properly positioned between the first and second elements (e.g., filling the gap between the elements), the material of the intermediate element can change to a second state in which the material adheres to both the first and second elements to provide a structurally sound bond (e.g., a mechanical bond) between them. For example, the material can harden and provide structural integrity between the first and second elements. Because the material can flow into any gap between the first and second elements while in the first state, the material can absorb or erase variations in the manufacturing of the first and second materials due to low manufacturing tolerances of those elements, while ensuring that the resulting component is constructed with higher precision than its individual components.

This approach may in addition reduce the complexity and detail required to construct the first and second elements. In particular, because the material of the intermediate element can flow in the first state, the material can flow around and into features of each of the first and second elements (as described below) to ensure that the material is securely coupled to each of the first and second elements. Furthermore, this approach can be forgiving of imperfections and other manufacturing artifacts along the exposed surface of each of the first and second elements. In fact, the opposing surfaces of the first and second elements may not need to have corresponding features, as the opposing surfaces of the first and second elements may not engage or need to be placed in close proximity (e.g., as would otherwise be required with an adhesive). Instead, the material injected into the mold can flow around the features, and accommodate any offsets or misalignments of the features.

Any suitable process can be used to provide the material of the intermediate element between the first and second elements. In some embodiments, a molding process by which a material is initially inserted in a liquid state and which subsequently hardens can be used. For example, one or more of injection molding, compression molding, transfer molding, extrusion molding, blow molding, thermoforming or vacuum forming, or rotomolding processes can be used. Using a molding process, material can flow around first and second elements 210 and 212, and the material can accommodate irregularities and defects of the elements, while subsequently changing state to provide structural integrity and define an integral component with high degrees of tolerance.

In some embodiments, a brazing process can be used instead of or in addition to a molding process. For example, a dielectric composite material can be brazed between the first and second elements. In one implementation, a composite material can be placed in a fixture between the first and second elements to be connected, and the composite material can be heated so that it melts and fills a region between the conductive elements (e.g., is distributed between the conductive elements by capillary action or wetting). For example, the fixture and composite material can be placed in contact with a heated surface causing the composite material to heat and flow. The composite material can be cooled once it has filled the region between the conductive elements, forming a secure bond between the composite material and each of the conductive elements. Any suitable type of brazing can be used including, for example, torch blazing, furnace brazing, braze welding, vacuum brazing, or dip brazing. The filler material can include any suitable composite material, including various particular dielectric or insulating composite materials such as, for example, plastic, rubber, organic composites, non-conductive metal alloys, or combinations of these. Furthermore, the geometry of features along internal surfaces of the conductive elements can be selected and designed to enhance the brazed bond.

The particular material and process used can be finished to provide an aesthetically pleasing connecting component that will be exposed as part of the device housing. In some embodiments, a finishing process (e.g., a grinding process) can be used to clean up the interface between the first and second elements and the intermediate elements. Alternatively, a finishing process can be used to define a final color, texture or other aesthetic attribute of the component, as provided for by industrial design considerations. In some cases, the particular materials used, or the particular process used can be selected based on a desired cosmetic effect (e.g., a visual or tactile effect).

Figure 3:
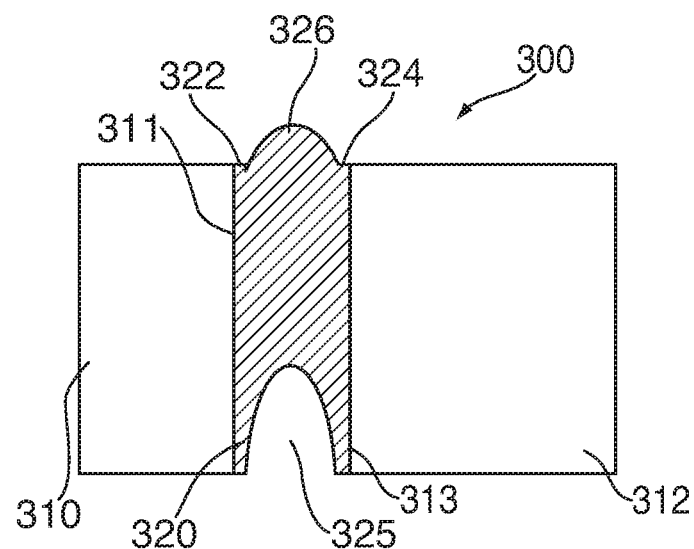
FIG. 3 is a schematic view of an illustrative electronic device housing component having a variable size intermediate element in accordance with one embodiment of the invention.

FIG. 3 is a schematic view of an illustrative electronic device housing component having a variable size intermediate element in accordance with one embodiment of the invention. Component 300 can be constructed by coupling first and second elements 310 and 312, which can include some or all of the features of first and second elements 210 and 212 (FIG. 2).

Intermediate element 320, which can include some or all of the features of intermediate element 220 (FIG. 2), can include contact regions 322 and 324 placed in contact with surfaces of first and second elements 310 and 312 (i.e., interior side surfaces of those elements), respectively. Contact regions 322 and 324 can be sized such that at least a minimum surface area of each of first element 310 and second element 312 is in contact with intermediate element 320. The minimum contact surface can be determined, for example, from a desired or expected retention force between the intermediate element and each of first and second elements 310 and 312.

Intermediate element 320 can have any suitable shape or feature between contact regions 322 and 324. For example, intermediate element 320 can include one or more openings (e.g., for receiving a button or for allowing sound or light waves to pass), protrusions, detents, chamfers, expansions, regressions, or combinations of these. In the example shown in FIG. 3, intermediate element 320 can include cutout 325 and bump 326, which can have the same or different shapes. In some embodiments, one or more of the features of intermediate element 320 can be selected for cosmetic or aesthetic reasons.

Intermediate element 320 can have any suitable size relative to one or both of first element 310 and second element 312. In some embodiments, first element 310 can include internal surface 311 having a periphery that defines a boundary for internal surface 311. Similarly, second element 312 can include internal surface 313 having a periphery that defines a boundary for internal surface 313. Intermediate element 320 can come into contact (and be coupled) with first element 310 and second element 312 such that the portions of intermediate element 320 that are in contact with first element 310 and second element 312 are within the peripheries or boundaries of internal surfaces 311 and 313, respectively. In other words, there may be no portion of intermediate element 320 that extends beyond the periphery of each internal region and comes into contact with an external surface of first element 310 or second element 312 (e.g., with a top surface). In some cases, intermediate element 320 can be constrained to the periphery of the internal surface of only one of first element 310 and second element 312.

In some cases, it may be desirable to limit the space of the intermediate element between two other elements in a component. In particular, it may be desirable for a cross-section of the intermediate element to be no larger than a cross-section of an element to which it is connected (e.g., less than at least one of the first and second elements), as this can allow a component size to be reduced and thus reduce the overall size of the electronic device or ensure that internal components in an electronic device are tightly disposed.

Figure 4:
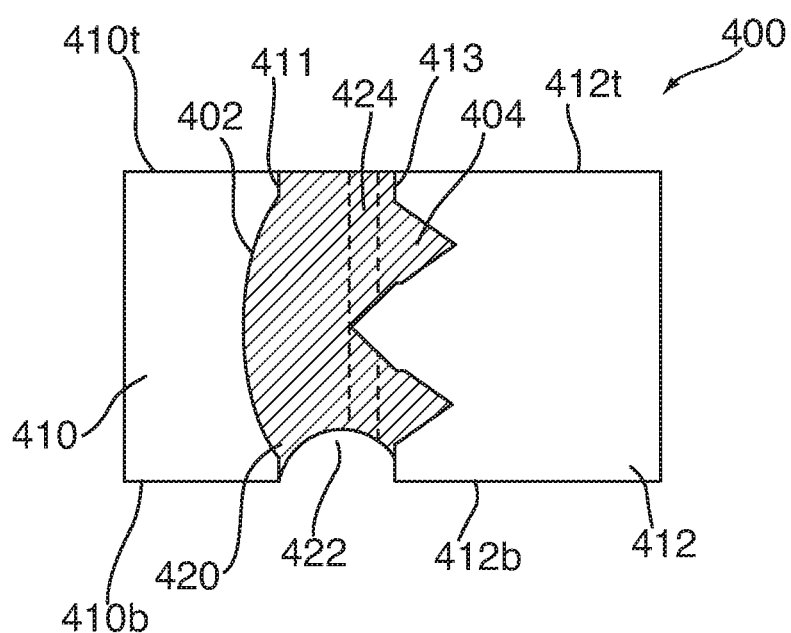
FIG. 4 is a cross-sectional view of an illustrative component formed by connecting two elements in accordance with one embodiment of the invention.

FIG. 4 is a cross-sectional view of an illustrative component formed by connecting two elements in accordance with one embodiment of the invention. Component 400 can be constructed by connecting first and second elements 410 and 412 using intermediate element 420. The elements of component 400 can include some or all of the features of the corresponding elements described above (e.g., in connection with FIGS. 2 and 3). Intermediate element 420 can have any suitable size including, for example, a height or width that is less than the corresponding height or width of elements 410 and 412. In particular, intermediate element 420 may be constrained from extending beyond a side surface of first and second elements 410 and 412 in a region adjacent to the interface with the first and second elements. In some embodiments, intermediate element 420 may not extend past a plane defined by side surfaces of first and second elements 410 and 412 (e.g., top and bottom surfaces 410*t*, 410*b*, 412*t* and 412*b*, respectively).

To enhance the interface between intermediate element 420 and each of the individual first and second elements 410 and 412, each of elements 410 and 412 can include one or more internal features that provide locking means, or increase the surface area that can be used for adhering intermediate element 420 to each of the first and second elements. For example, first element 410 can include a curved internal feature 402 along interface surface 411. Feature 402 can define a curved recess (e.g., a spherical or cylindrical recess) into which material from intermediate element 420 can extend. The additional surface area created along internal surface 411 (e.g., as opposed to a flat, planar internal surface) can increase surface tension based force. In addition, the particular shape and size of internal feature 402 can be selected based on a desired resistance force between first element 410 and intermediate element 420. For example, internal feature 402 can extend into first element 410 such that the portion of intermediate element 420 extending into the internal feature forms a beam operative to resist bending in directions along surface 411. Feature 402 can extend in or out of a plane that includes a periphery of internal surface 411 (or feature 404 can extend in or out of a plane that includes a periphery of internal surface 413).

In some embodiments, feature 402 can instead or in addition extend out from surface 411. For example, feature 402 can include a dome, beam, or other protrusion extending out of first element 410. To further enhance the interface between intermediate element 420 and first element 410, feature 402 can include one or more openings, holes, hooks or other features that can engage a corresponding feature of intermediate element 420 once it changes to the second state (e.g., a hole in feature 402 into which a post of hardened intermediate element 420 can extend).

Each of first and second elements 410 and 412 can include the same or different retention features. For example, second element 412 can include internal feature 404 along interface surface 413. Feature 404 can include any suitable feature including, for example, one or more of the features described in the context of feature 402. In particular, feature 404 can include several indentations having the same or different shapes or sizes, such as those illustrated in FIG. 4. In the example of FIG. 4, feature 404 can include several pyramid or cone-shaped indentations (e.g., recessed relative to surface 413), and pyramid or cone-shaped protrusions extending beyond surface 413. In some embodiments, feature 404 can include one more recessed edges at the interface between the recessed and protruding features forming a hook into which material from intermediate element 420 can flow.

Intermediate element 420 can ultimately include any suitable feature to mate with first and second elements 410 and 412 (the features of intermediate element 420 are formed after the material of element 420 changes to the second state). For example, intermediate element 420 can have a height that is less than that of either of elements 410 and 412. In particular, intermediate element 420 can ultimately include recessed region 422, which can be used to retain a larger electrical component. As another example, intermediate element 420 can include opening 424 through the connecting element. The opening can be used to step one or more wires or electrical connectors through intermediate element 420, or can serve as a via or pathway for audio or light. In some embodiments, opening 424 can be placed near a microphone, IR sensor, an ambient light sensor, or other sensors. The features included within the body of intermediate element 420 can be constructed at any suitable time including, for example, before intermediate element 420 is coupled to elements 410 and 412, once the intermediate element is coupled to one or more of elements 410 and 412, or while the intermediate element is coupled to one or more of elements 410 and 412.

Figure 5A:
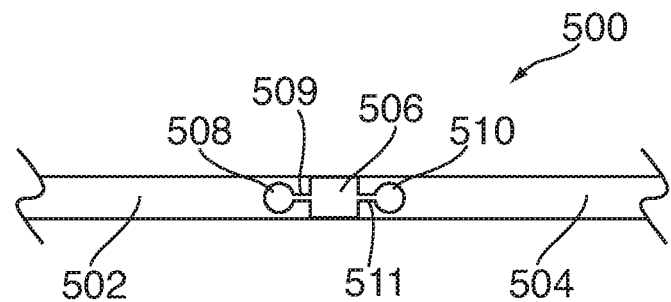
FIGS. 5A-5C are schematic top views of illustrative components that include an intermediate element in accordance with some embodiments of the invention.
Figure 5B:
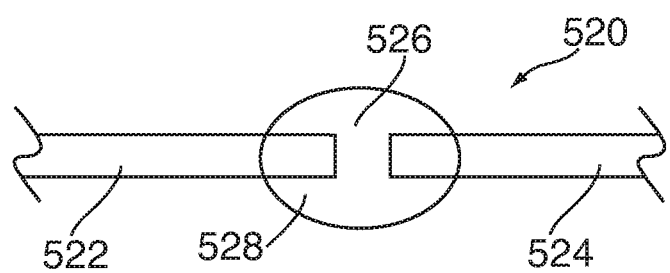
Figure 5C:
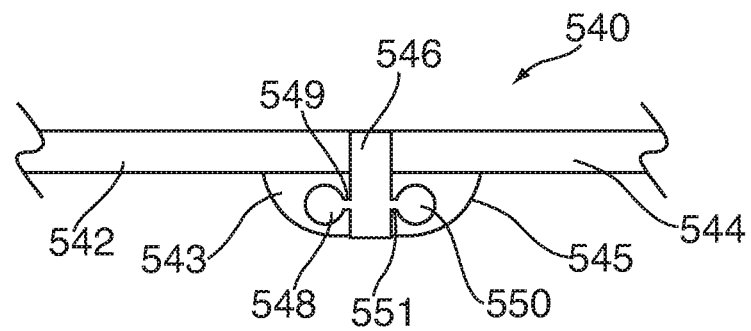

The elements connected by the intermediate element can include any suitable feature for improving the adhesion between the elements and the intermediate element. FIGS. 5A-5C are schematic top views of illustrative components that include an intermediate element in accordance with some embodiments of the invention. The elements of the components described below can have some or all of the features or attributes of the corresponding elements described above. Component 500 shown in FIG. 5A can be constructed by connecting first element 502 and second element 504 using intermediate element 506. To improve the adhesion between first element 502 and intermediate element 506, first element 502 can include opening 508 within the body of the first element that is accessible from the surface of the first element that is in contact with intermediate element 506 by channel 509. Similarly, second element 504 can include opening 510 within the body of second element 504 that is accessible from the surface of the second element that is in contact with intermediate element 506 by channel 511. The openings and channels can have any suitable size or shape including, for example, a shape selected such that the channel is smaller than the opening. This can ensure that material of intermediate element 506 flowing into the opening cannot pass back through the channel, and thus improve the retention of the intermediate element (e.g., the through bore or opening forms an undercut or interlock). The opening can have any suitable shape including, for example, a curved or angled cross-section, or a variable cross-section. The opening can extend through some, or all, of the first or second element including, for example, through only an internal portion of the element (e.g., to prevent the material of the intermediate element extending in the opening from being exposed at an external surface of the element).

Component 520 shown in FIG. 5B can be constructed by connecting first and second elements 522 and 524 using intermediate element 526. To improve the adhesion intermediate element 526 to the first and second elements, intermediate element 526 can include overflowing portions 528 extending beyond the cross-section of the first and second elements, which comes into contact with exposed surfaces of the first and second elements (e.g., surfaces other than the interfacing surfaces that oppose one another within the component). Overflowing portions 528 can extend over any suitable surface of the first and second elements including, for example, only over one or more of a top, bottom, front or back surface, and/or along only one of the first and second elements, or various combinations of these.

Component 540 shown in FIG. 5C can be constructed by connecting first and second elements 542 and 544 using intermediate element 546. First and second elements 542 and 546 can include openings 548 and 550, and channels 549 and 551, respectively, as described above in connection with component 500. To allow openings 548 and 550 to extend through the entire height of the first and second components, while maintaining uniform and consistent external surfaces of the elements, the first and second elements can include chamfers 543 and 545, respectively, extending from a surface of the elements. For example, the chamfers can extend from an internal surface of the elements, such that the chamfers extend within an internal volume of a device that includes the component. The chamfer can have any suitable height including, for example, a height that matches that of the main body of each element, or a height that is less than that of the main body. In particular, the chamfers can be recessed relative to top and bottom surfaces of the first and second elements. Openings 548 and 550 can extend through the chamfers instead of or in addition to the main bodies of the elements.

FIGS. 6A-6D are schematic views of an interface in illustrative components that include an intermediate element in accordance with some embodiments of the invention. The elements shown in FIGS. 6A-6D can include any suitable feature or attribute of corresponding elements described above. In particular, elements can include chamfers, openings and/or channels as described above in connection with FIGS. 5A-5C. Component 600 shown in FIG. 6A can be constructed by connecting first element 602 and second element 604 using intermediate element 606. First and second elements 602 and 604 can each include an opening and channel as described above with respect to component 500 (FIG. 5A). In addition, first and second elements 602 and 604 can include cuts 603 and 605 along the interior surfaces of the elements to provide resistance to shear forces. In particular, as a shear force is applied to move the first and second elements relative to each other along the plane 608 of the element interface, material from the intermediate element placed in the cuts can provide more resistance than material in the openings. Cuts 603 and 605 can have any suitable shape including, for example, linear, curved, or variable shapes. The depth and thickness of the cuts can be selected and vary based on any suitable criteria, including resistance to external forces. Cuts 603 and 605 can be made using any suitable tool including, for example, a T-shape cutter.

Figure 6A:
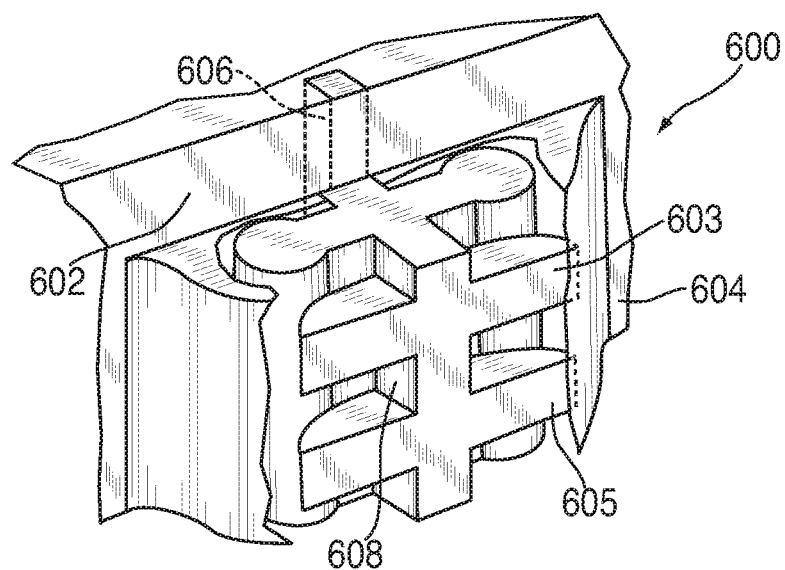
FIGS. 6A-6D are schematic views of an interface in illustrative components that include an intermediate element in accordance with some embodiments of the invention.
Figure 6B:
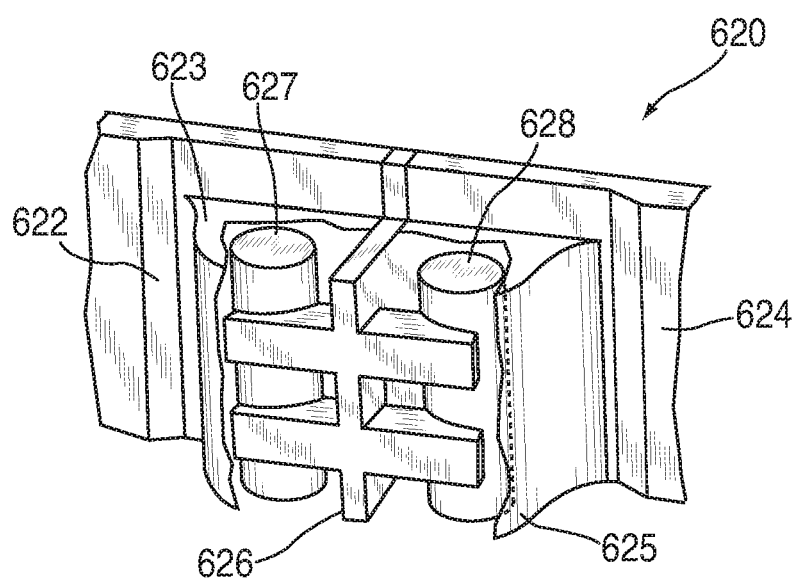

Component 620 shown in FIG. 6B can be constructed by connecting first element 622 and second element 624 using intermediate element 626, and can include some or all of the features of the various components described above, such as component 600. In contrast with component 600, however, the channels providing a path between the openings and the interface surface of the first and second elements may not extend through the entirety of the first and second elements. Instead, the channel may be entirely within the body of the first and second elements, such that top and bottom surfaces of the chamfers 623 and 625 are continuous except for openings 627 and 628. This can reduce stress on the first and second elements.

Figure 6C:
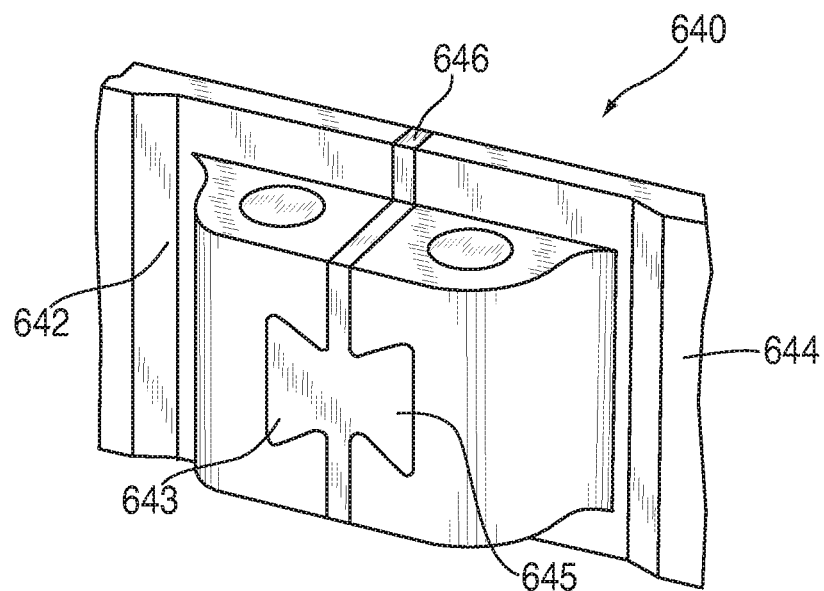

Component 640 shown in FIG. 6C can be constructed by connecting first element 642 and second element 644 using intermediate element 646, and can include some or all of the features of components 600 and 620. In contrast with components 600 and 620, however, the first and second elements may not include straight cuts. Instead, the first and second elements can include angled cuts 643 and 645, having interlocking features. Cuts 643 and 645 can be made using any suitable tool including, for example, a dovetail cutter.

Figure 6D:
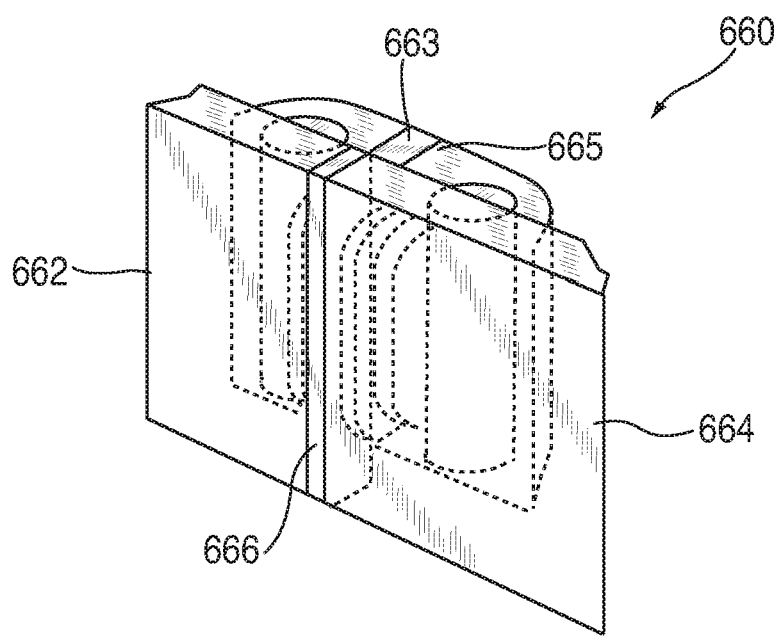

Component 660 shown in FIG. 6D can be constructed by connecting first element 662 and second element 664 using intermediate element 666, and can include some or all of the features of components 600, 620 and 640. In contrast with components 600, 620 and 640 described above, component 660 can include tapers 663 and 665 on internal surfaces of the first and second elements. The tapers can optimize capacitance, which may be necessary when the first and second elements are used as part of an electrical circuit.

The materials selected for the elements forming a component can be selected based on any suitable criteria. For example, materials can be selected based on mechanical properties (e.g., stiffness or resistance to particular applied forces), cosmetic or tactile properties (e.g., color or texture), thermal properties, electrical properties, or any other attribute or property of the material. Each element (e.g., the two or more elements connected by the intermediate element and the intermediate element) can be constructed from the same or different materials. For example, first and second elements can be constructed from a first material, and the intermediate element can be constructed from a second material.

In some embodiments, the first and second elements can be constructed from conductive materials to serve as part of two distinct electrical circuits. For example, the first and second elements can be constructed from a metal (e.g., steel) to serve as part of an antenna of an electronic device. To electrically isolate the two circuits, the intermediate element can be constructed, at least in part, from an insulating material that prevents electrical signals from being transmitted across the intermediate element between the first and second elements which are connected by the intermediate element. Any suitable insulating or dielectric material can be used including, for example, a plastic, composite material, glass, Teflon®, paper, or combinations of these. In some embodiments, the intermediate element can be constructed from a combination of conductive and insulating materials, where the insulating materials are disposed between the conductive materials.

Alternatively, one or more conductive materials can be embedded within insulating materials. By selecting a dielectric or insulating material for the intermediate element, it may be possible to control capacitance between two conductive first and second elements across the junction. In some embodiments, the intermediate element can instead or in addition be used to radiate RF energy. In particular, the intermediate element can be used to radiate RF energy generated or captured by the first and second elements when the first and second elements are included as part of one or more antenna assemblies.

Figure 7:
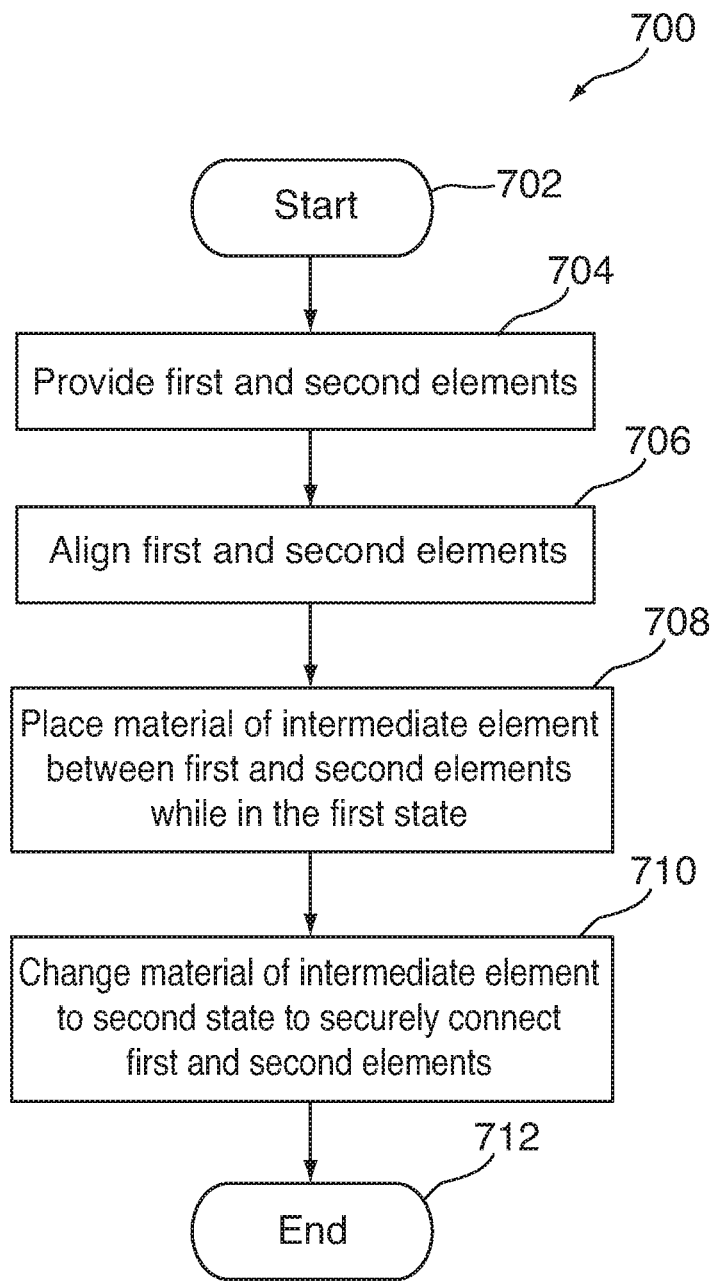
FIG. 7 is a flowchart of an illustrative process for connecting first and second elements of a component using an intermediate element that can change between two states in accordance with one embodiment of the invention.

FIG. 7 is a flowchart of an illustrative process for connecting first and second elements of a component using an intermediate element that can change between two states in accordance with one embodiment of the invention. Process 700 can begin at step 702. At step 704, first and second elements can be provided. For example, first and second elements can be manufactured using low tolerance processes to reduce costs. At step 706, the first and second elements can be aligned as desired for the resulting component. For example, opposing extensions of the first and second elements can be aligned such that the cross-sections of each of the extensions are opposite each other and aligned to form a planar surface (e.g., to form a continuous surface across the seam of first and second elements). In some embodiments, the first and second elements can be disposed in a position defining the component with a high tolerance. At step 708, a material used for an intermediate element can be placed between the first and second elements, while the material is in a first state. In the first state, the material can flow between the first and second elements to occupy the free space between the elements. For example, a plastic material can be heated and injected between the first and second elements. At step 710, the material of the intermediate element can change to a second state from the first state. In the second state, the material can adhere to the first and second elements, and provide a structurally sound bond between the elements. For example, an injection-molded plastic can harden after being applied in step 708. Process 700 can end at step 712.

Figure 8:
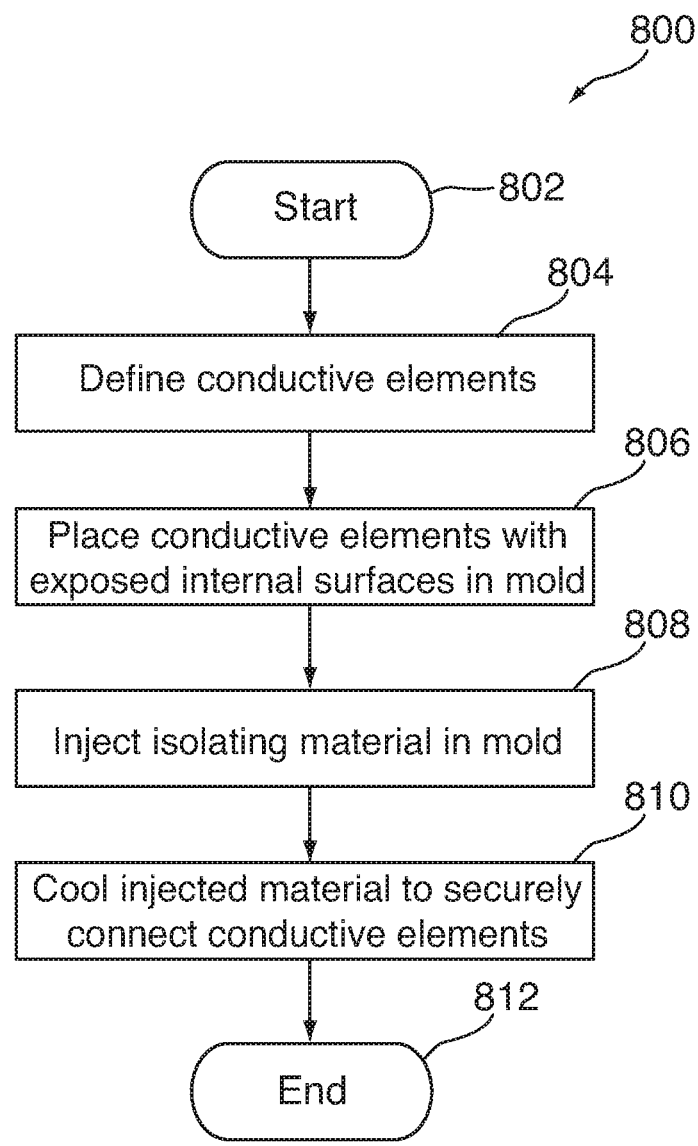
FIG. 8 is a flowchart of an illustrative process for connecting conductive elements in accordance with one embodiment of the invention.

FIG. 8 is a flowchart of an illustrative process for connecting conductive elements in accordance with one embodiment of the invention. Process 800 can begin at step 802. At step 804, conductive elements can be provided. For example, two or more conductive elements can be manufactured using any suitable process including, for example, machining, forging, working, stamping, or combinations of these. In some embodiments, one or more features can be incorporated in or on an internal surface of a conductive element, where the conductive elements are disposed in the component such that the internal surfaces face each other. At step 806, the conductive elements can be placed in a mold such that internal surfaces of the conductive elements are exposed within the mold volume. For example, the conductive elements can be placed in a mold such that material injected in the mold can come into contact with the internal surfaces. At step 808, material can be injected in the mold. For example, a plastic material can be injected in the mold. In some cases, a different insulating or dielectric material can be inserted in the mold. At step 810, the injected material can cool to securely connect the conductive elements and form the component. For example, a forced cooling system can be used to cool the injected material. Process 800 can then end at step 812.

The approaches described above can be used in connection with any electronic device component. For example, these approaches can be used in connection with an outer periphery member, as described in FIG. 1. In particular, these approaches can be used to provide distinct elements 110, 120 and 130 (FIG. 1) using a conductive material, where the distinct elements serve as part of different electrical circuits. To electrically isolate all of the elements, intermediate elements 114, 124 and 134 (FIG. 1) can be constructed from insulating or dielectric materials, as discussed above.

Figure 9:
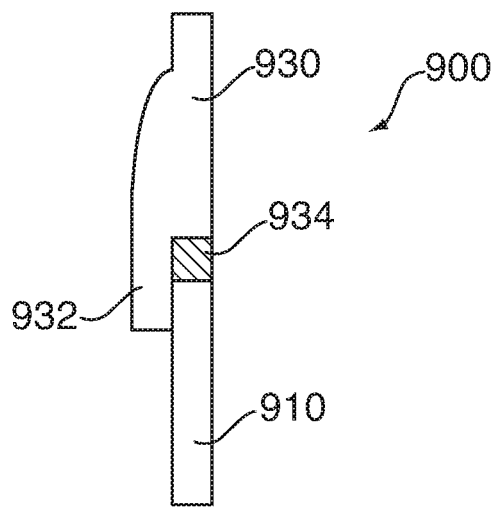
FIG. 9 is a detailed view of an illustrative interface between conductive elements in accordance with one embodiment of the invention.

In some cases, it may be desirable to provide a non-conductive connection between conductive elements while electrically connecting the conductive elements. For example, a split may be desirable for cosmetic reasons between elements 110 and 130 (e.g., at interface 132, FIG. 1), but conductive elements 110 and 130 may both be part of the same circuitry. Any suitable approach can be used to provide a hidden conductive path between the conductive elements. FIG. 9 is a detailed view of an illustrative interface between conductive elements in accordance with one embodiment of the invention. Outer periphery member 900 can include element 910 coupled to element 930 using non-conductive material 934 (e.g., provided by insert molding). To ensure that elements 910 and 930 are electrically coupled, one or both of the elements (e.g., element 930) can include arm 932 extending from element 930 within the volume enclosed by outer periphery member 900 (e.g., along a surface opposite an external surface of the outer periphery member). Arm 932 can extend across the gap between elements 910 and 930 (e.g., over material 934) and connect to the inner surface of element 910, for example as a lap joint. Any suitable conductive coupling process can be used to connect arm 932 to element 910 including, for example, welding, soldering, a conductive adhesive, or combinations of these. In some embodiments, the connection between arm 932 and element 910 can provide a structurally sound bond between arm 932 and element 910. In such cases, material 934 may simply serve as a cosmetic surface, and not provide a structural bond connecting the arm and element together.

Figure 10:
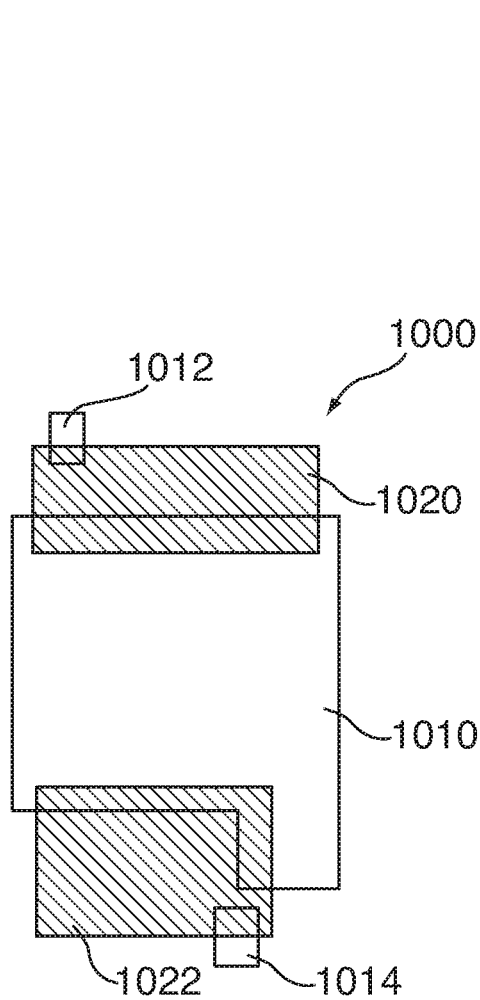
FIG. 10 is a schematic view of an illustrative internal platform used in an electronic device in accordance with one embodiment of the invention.

In some embodiments, one or more internal components of an electronic device can include conductive elements used in different electrical circuits that are connected using a non-conductive intermediate element. FIG. 10 is a schematic view of an illustrative internal platform that can be used in an electronic device in accordance with one embodiment of the invention. Internal platform 1000 can be placed within an electronic device to support or retain electrical components. Internal platform 1000 can include several distinct conductive plates (e.g., metal plates), including base plate 1010, top step 1012, and bottom step 1014. The plate and steps can have any suitable size including, for example, a large plate cover a substantial portion of the volume enclosed by an outer periphery member (e.g., 40%, 50%, 60%, 70%, 80% or 90%). Alternatively, the entire internal platform 1000 can cover only a portion of the volume enclosed by an outer periphery member (e.g., 60%, 70%, 80%, 90%, or more). The steps can be substantially smaller than the plate including, for example, serving as tabs to ground portions of internal platform 1000.

Each of the plates and steps can be constructed from the same or different material including, for example, from a same conductive material (e.g., from a metal). In some embodiments, one or more of the steps can be incorporated in the same piece of material used to form the plate. For example, step 1014 can include a stepped-up region of plate 1010. Alternatively, a step can be constructed from a different piece of material than the plate. For example, step 1012 can be constructed from a different piece of material that plate 1010. Plate 1010 and steps 1012 and 1014 can be placed in the same or different planes. In one implementation, base plate 1010 can be placed at a first level, while steps 1012 and 1014 can be offset relative to base plate 1010 (e.g., stepped up towards the front surface of the device). Steps 1012 and 1014 can be stepped by any suitable amount including, for example, a substantially identical amount (e.g., such that steps 1012 and 1014 are substantially in the same plane). For example, steps 1012 and 1014 can be positioned such that the front surfaces of the step are flush or slightly sub flush relative to a front surface of an outer periphery member, to which the steps are connected. Breaks in internal platform 1000 for distinguishing between plate 1010 and steps 1012 and 1014 can be provided at any suitable position. For example, the breaks can be located as part of the stepped up surface, as the step, or on the plate. In some embodiments, the distinction between a plate and step can be arbitrary because the step and plate are constructed from a single piece of material.

Plate 1010 and steps 1012 and 1014 can be at least partially electrically isolated to ensure that elements of an outer periphery member remain electrically isolated (e.g., to guarantee antenna performance). For example, step 1012 can be connected to plate 1010, or to a stepped up portion of plate 1010 using connecting element 1020. Connecting element 1020 can be constructed from any suitable material, including for example a suitable insulating material (e.g., plastic injection molded between step 1012 and plate 1010). As another example, step 1014 can be incorporated as part of the piece of material used to form plate 1010, and can therefore be electrically connected to the plate. Step 1014 can include connecting element 1022 placed on a front surface of the step, for example mirroring connecting element 1020. In particular, connecting elements 1020 and 1022 can be positioned to extend forward from a front surface of an outer periphery member. Connecting elements 1020 and 1022 can be provided using any suitable approach, including for example by molding material (e.g., plastic) between the plate and the steps, or on a surface of one or more of the plate and steps. Connecting elements 1020 and 1022 can have any suitable shape including, for example, a planar shape or a three-dimensional shape (e.g., including a step to connect plate 1010 to one or more of steps 1012 and 1014 positioned in different planes). Elements 1020 and 1022 can form distinct elements, or can instead be different portions of a continuous element. In some embodiments, connecting elements 1020 and 1022 can be connected to the outer periphery member in a manner that electrically isolates different sections of plate 1010 (e.g., as shown, for example, in FIG. 10). Alternatively, connecting elements 1020 and 1022 can be provided in a manner to electrically insulate different sections of an outer periphery member (e.g., insulate elements 1110 and 1120, FIG. 11, but only in the vicinity of step 1014, as required for antenna performance).

Figure 11:
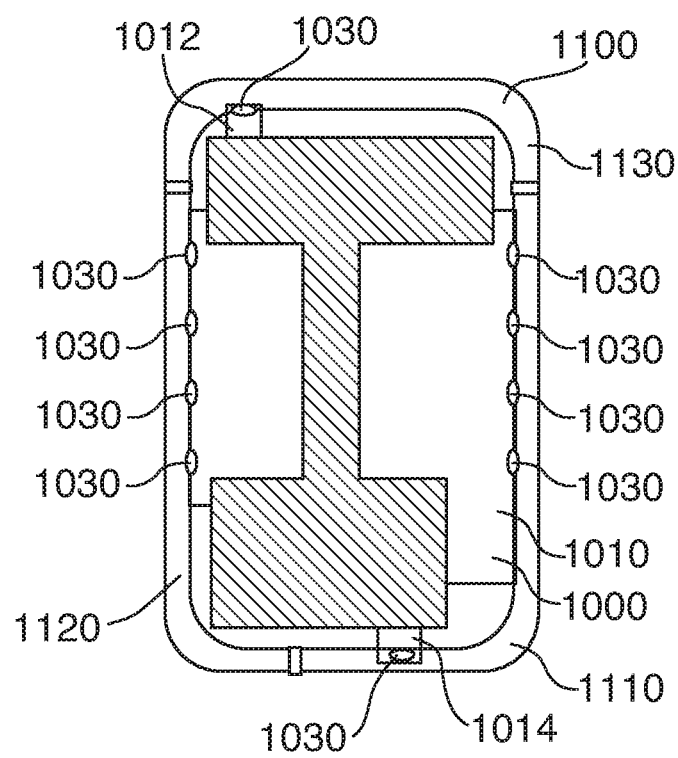
FIG. 11 is a schematic view of the illustrative internal platform of FIG. 10 coupled to an outer periphery member in accordance with one embodiment of the invention.

Internal platform 1000 can be coupled to the outer periphery member using any suitable approach. In some embodiments, portions of plate 1010 and steps 1012 and 1014 can extend beyond the edges of connecting elements 1020 and 1022 so that the internal platform can be coupled to the outer periphery member via the metal plate and steps. FIG. 11 is a schematic view of the illustrative internal platform of FIG. 10 coupled to an outer periphery member in accordance with one embodiment of the invention. Internal platform 1000 can be coupled to outer periphery member 1100 using any suitable approach. In some embodiments, the metal elements of the internal platform can be coupled to the metal outer periphery member for grounding or antenna performance. For example, exposed metal surfaces of plate 1010 and steps 1012 can be coupled to outer periphery member 1100 using welding, soldering, or any other connection process that maintains conductivity. Alternatively, one or more of heat staking, an adhesive, tape, a fastener, or other non-conductive connection processes can be used. When a conductive process is used, such as welds 1030 (e.g., laser welds), the welds can be distributed such that the outer periphery member elements that are to remain electrically isolated remain isolated. In particular, welds 1030 along plate 1010 can be positioned such that small L-shaped element 1120 is electrically isolated from large L-shaped element 1110 and U-shaped element 1130. Alternatively, if it is important for small shaped element 1120 and large shaped element 1110 to be electrically insulated only in the vicinity of the interface between the elements, welds 1030 can be distributed such that an electrically conductive path exists between elements 1110 and 1120 through plate 1010, and not through step 1014.

Internal platform 1000 can be coupled to any suitable portion of outer periphery member 1100. For example, internal platform 1000 can be assembled within the height of outer periphery member 1100 (e.g., based on the position of contact points or regions of the outer periphery member). The distribution of the contact points can be selected based on structural considerations including, for example, based on a desired resistance to torsion or bending. In particular, the electronic device can include at least four contact points or regions distributed within outer periphery member 1100 (e.g., near the corners of the outer periphery member). As another example, internal platform 1000 can include contact regions along the straight portions of outer periphery member 1100 (e.g., along the edges of plate 1010). As still another example, stepped regions of internal platform 1000 (e.g., elements 1020 and 1022) can be coupled to the front or back surfaces of outer periphery member 1100 (e.g., on opposite portions of the front or back surfaces). In some embodiments, outer periphery member 1100 can include one or more tabs or extensions for supporting internal platform 1000 (e.g., tabs on which the platform is soldered or welded).

In some embodiments, internal platform 1000 can be placed within the height of outer periphery member 1100 such that components can be placed on both the front and back surfaces of internal platform 1000. For example, some components can be inserted from a back surface, and some components can be inserted from a front surface. The components can be coupled to an internal platform for security, and can instead or in addition be electrically connected to each other through an opening in the internal platform. In some embodiments, some components can first be coupled to back and front cover assemblies, respectively, before being inserted in an internal volume and coupled to an outer periphery member. In effect, by its position internal platform 1000 can define back and front pockets or regions within the volume in which electronic device components can be placed. The size of each pocket or region can be determined based on any suitable criteria including, for example, the number and size of components to place in each region, the required position of internal platform 1000 relative to the outer periphery member (e.g., if available positions are limited due to structural requirements), or combinations of these. The components can be coupled to internal platform 1000 for security, and can instead, or in addition, be electrically connected to each other through an opening in internal platform 1000. Internal platform 1000 can include any suitable feature for securing or connecting electronic device components, such as one or more snaps, prongs, chamfers, extends, openings, access points, doors, or combinations of these. In some cases, internal platform 1000 can include one or more dedicated features for receiving or securing specific electrical components, such as speakers, microphones, audio jacks, cameras, light sources, chips, or combinations of these.

The previously described embodiments are presented for purposes of illustration and not of limitation. It is understood that one or more features of an embodiment can be combined with one or more features of another embodiment to provide systems and/or methods without deviating from the spirit and scope of the invention.

What is claimed is:
1. An electronic device comprising:
a front cover assembly defining a front side of the electronic device;
a back cover assembly defining a back side of the electronic device; and
a housing positioned between and coupled to the front cover assembly and the back cover assembly, the housing defining four peripheral sides of the electronic device and comprising:
a first housing element formed from a first conductive material and defining a corner of the electronic device, the first housing element configured to operate as an antenna of the electronic device;
a second housing element formed from a second conductive material and defining a first portion of a peripheral side of the four peripheral sides, the peripheral side of the electronic device extending from the front side of the electronic device to the back side of the electronic device; and
an intermediate housing element formed from a dielectric material and positioned at least partially within a gap defined between the first housing element and the second housing element, the intermediate housing element structurally coupling the first housing element to the second housing element and defining a second portion of the peripheral side of the electronic device.

2. The electronic device of claim 1, wherein:
the housing at least partially defines an internal volume of the electronic device;
the first housing element defines a first internal element that extends into the internal volume;
the second housing element defines a second internal element that extends into the internal volume; and
the intermediate housing element is molded at least partially around the first and second internal elements.

3. The electronic device of claim 2, wherein:
the first internal element defines a first opening;
the second internal element defines a second opening; and
the dielectric material of the intermediate housing element at least partially fills the first and second openings.

4. The electronic device of claim 1, wherein:
the corner of the electronic device is a first corner of the electronic device;
the second housing element defines a second corner of the electronic device;
the antenna is a first antenna; and
the second housing element is configured to operate as a second antenna of the electronic device.

5. The electronic device of claim 1, wherein:
the corner of the electronic device is a first corner of the electronic device;
the intermediate housing element is a first intermediate housing element;
the dielectric material is a first dielectric material; and
the housing further comprises:
a third housing element formed from a third conductive material and defining a second corner of the electronic device;
a second intermediate housing element formed from a second dielectric material and positioned at least partially between the second and third housing elements; and
a third intermediate housing element formed from a third dielectric material and positioned at least partially between the third and first housing elements.

6. The electronic device of claim 5, wherein the first housing element, the second housing element, the third housing element, the first intermediate housing element, the second intermediate housing element, and the third intermediate housing element define a closed loop.

7. The electronic device of claim 1, wherein:
the electronic device further comprises an internal platform;
the internal platform supports one or more electrical components; and
the one or more electrical components are electrically coupled to the first housing element of the housing.

8. The electronic device of claim 1, wherein the first conductive material and the second conductive material are an aluminum material.

9. A portable electronic device comprising:
an electronic circuit; and
a housing defining four peripheral sides of the portable electronic device and enclosing the electronic circuit, the housing comprising:
a first conductive element formed from a first metal material and defining a first portion of an external surface of the housing along a corner of the housing, the first conductive element configured to function as an antenna of the portable electronic device;
a second conductive element formed from a second metal material and defining a second portion of the external surface of the housing along a side of the housing; and
an intermediate element formed from a plastic material and positioned at least partially between the first conductive element and the second conductive element;
a front cover coupled to the housing and defining a front side of the portable electronic device; and
a back cover coupled to the housing and defining a back side of the portable electronic device.

10. The portable electronic device of claim 9, wherein:
the first conductive element defines a first internal protrusion;
the second conductive element defines a second internal protrusion; and
the plastic material of the intermediate element is molded between the first conductive element and the second conductive element and structurally engages with the first and second internal protrusions.

11. The portable electronic device of claim 10, wherein:
the first internal protrusion defines a first recess;
the second internal protrusion defines a second recess; and
the plastic material of the intermediate element at least partially fills the first and second recesses.

12. The portable electronic device of claim 9, wherein:
the antenna is a first antenna; and
the second conductive element is configured to operate as a second antenna of the portable electronic device.

13. The portable electronic device of claim 9, wherein the first metal material and the second metal material are a steel material.

14. A housing for an electronic device, the housing defining an internal volume and comprising:
a first metal housing component defining a first exterior corner of the housing and a first portion of a peripheral exterior side surface of the housing and configured to operate as a first antenna of the electronic device;
a second metal housing component defining a second exterior corner of the housing and a second portion of the peripheral exterior side surface of the housing and configured to operate as a second antenna of the electronic device; and
a plastic housing component defining a third portion of the peripheral exterior side surface of the housing and positioned at least partially between the first metal housing component and the second metal housing component.

15. The housing of claim 14, wherein:
the first metal housing component defines a first chamfer having a first opening;
the second metal housing component defines a second chamfer having a second opening; and
the plastic housing component at least partially fills the first and second openings.

16. The housing of claim 15, wherein the first and second openings have a cylindrical shape.

17. The housing of claim 14, wherein the plastic housing component is molded between a gap defined between the first metal housing component and the second metal housing component.

18. The housing of claim 14, wherein the plastic housing component bonds the first metal housing component to the second metal housing component.

19. The housing of claim 14, wherein the plastic housing component electrically insulates the first metal housing component from the second metal housing component.

20. The housing of claim 14, wherein the first metal housing component, the second metal housing component, and the plastic housing component define at least a portion of a closed loop that defines a continuous external sidewall of the housing.

* * * * *